US006833799B2

(12) United States Patent
Ohlsson

(10) Patent No.: US 6,833,799 B2
(45) Date of Patent: Dec. 21, 2004

(54) ULTRA LOW POWER ADAPTIVE PULSE DISTANCE RATIO DECODER FOR CODED DATA BY FEEDBACK OF OUTPUT DATA

(75) Inventor: Tony H. Ohlsson, Grillby (SE)

(73) Assignee: Zarlink Semiconductor AB, Jarfalla (SE)

( * ) Notice: Subject to any disclaimer, the term of this patent is extended or adjusted under 35 U.S.C. 154(b) by 0 days.

(21) Appl. No.: 10/353,234

(22) Filed: Jan. 28, 2003

(65) Prior Publication Data

US 2003/0174078 A1 Sep. 18, 2003

(30) Foreign Application Priority Data

Jan. 31, 2002 (GB) .............................................. 0202189

(51) Int. Cl.[7] .............................................. H03M 7/12
(52) U.S. Cl. .......................................... 341/70; 375/87
(58) Field of Search ............................. 341/70, 50, 53, 341/68; 375/87, 55, 84, 95, 110, 119

(56) References Cited

U.S. PATENT DOCUMENTS

| 3,506,923 | A | | 4/1970 | Ambrico et al. |
| 4,599,736 | A | * | 7/1986 | Hoppe ........................ 375/110 |
| 5,163,067 | A | * | 11/1992 | Wight et al. ................... 375/87 |
| 5,748,123 | A | * | 5/1998 | Lee ............................. 341/70 |
| 6,133,858 | A | * | 10/2000 | Karl et al. ..................... 341/53 |

FOREIGN PATENT DOCUMENTS

JP 60-160251 8/1985

OTHER PUBLICATIONS

Mason, A., Rytchenkov, V. : "Fiber Optic Repeater with Compensation of Pulse Width Distortion"; 1995 IEEE Nuclear Science Symposium and Medical Imaging Conference Record; vol. 1, Oct. 21–28, 1995; pp. 318–320; New York, USA.

* cited by examiner

Primary Examiner—Brian Young
Assistant Examiner—Joseph Lauture
(74) Attorney, Agent, or Firm—Lawrence E. Laubscher, Jr.

(57) ABSTRACT

A pulse decoder for decoding digitally coded data, each data bit being represented by a coding scheme consisting of a combination of short and long duration pulses having a predetermined interrelationship. The decoder has an input for receiving an input signal defining respective long and short time periods derived from the digitally coded data. An analog signal processing element generates output pulses from the input signal. The output pulses have a variable duty cycle dependent on the input signal and a control parameter. A feedback loop generates a control signal for adjusting the control parameter so that the duty cycle of the output signal matches the predetermined relationship.

24 Claims, 3 Drawing Sheets

ULTRA LOW POWER ADAPTIVE PULSE DISTANCE RATIO DECODER FOR CODED DATA BY FEEDBACK OF OUTPUT DATA

FIELD OF THE INVENTION

This invention relates to the field of data transmission, and more particularly to a method and apparatus for decoding coded data having a regular pattern.

BACKGROUND OF THE INVENTION

When it is desired to transmit data as a bit stream over a physical transmission medium, some means must be employed for converting the stream of 1's and 0's into physical signals. One technique for transmitting data over a physical link is known as "Manchester coding". In Manchester coded data, a "1" is coded as a short time period followed by a long time period, and a "0" is coded by a long time period followed by a short time period, where a long time period is twice a short time period.

In some applications, such as marking underground pipes, "tag" devices are employed. A tag is an electronic marker containing memory that can be read out by a remote reader. In a typical application the tag might be buried in the ground to mark where water, gas pipes and electrical wires are placed and by whom. The tag can be located and read by a reader that looks like a metal detector.

The tag contains a coil and a chip. There are no batteries since the tag uses the transmitted signal as a power source. Where data is transmitted to the chip using this kind of coding, it is not possible to have oscillators and counters on the chip because of the high current consumption at the frequencies required for time measurements. For ultra low power applications it is a continual challenge to design circuits with low current consumption in the decoding of data.

SUMMARY OF THE INVENTION

The present invention provides a decoder capable of ultra low power consumption that uses an analog decoding circuit. The invention takes advantage of the fact that in the case of a coding scheme consisting of a combination of short and long duration pulses having a predetermined interrelationship, such as a Manchester coding scheme, the average duty cycle of an output stream derived from one of said pulses is predictable.

According to the present invention there is provided a decoder for decoding a stream of encoded data bits, each data bit being represented by a coding scheme, comprising an input for receiving said stream of encoded data bits; an analog signal processor for generating output pulses from said stream of encoded data bits; and a feedback loop for providing a control signal to adjust a control parameter governing said analog signal processor so that the average duty cycle of said output pulses matches a predetermined expected relationship for said coding scheme.

The invention is based on the fact that the input signal has a predetermined coding scheme consisting of short and long duration pulses for each data bit. For example, in the case of Manchester coding each bit consists of a short and long period in each time slice defining a bit, so over a period of time the ratio of short or long periods to the total duration of a bit will be constant. The output data will have a regularity that can be measured and fedback as a control signal. When the output ratio, i.e. average duty cycle, matches the known ratio for the input signal, it follows that the device is accurately decoding the data.

The novel decoder can use analog decoding that also makes the circuit adaptive to different data rates and can be self trimmed, removing the need for trimming to compensate for process variations during manufacture.

The decoder also draws extremely low power compared to a digital implementation of a pulse distance decoder needed for any digitally coded data with a measurable regular pattern in it.

A simple RC-filter (charge pump) can be used to measure the voltage average of the output signal and feed back this to adjust the duty cycle of the output until the average value reaches the value that would be expected. The feedback signal changes the slope of the ramp in the circuit.

The invention further provides a method of a stream of encoded data bits, each data bit being represented by a coding scheme consisting of a combination of short and long duration pulses having a predetermined interrelationship, comprising receiving said stream of encoded data bits; generating output pulses from said stream of encoded data bits in an analog signal processor; and generating a feedback control signal from said output pulses to adjust said analog signal processor so that the average duty cycle of said output pulses matches a predetermined expected relationship for said coding scheme.

BRIEF DESCRIPTION OF THE DRAWINGS

This invention will be described in more detail, by way of example only, with reference to the accompanying drawings, in which.

DETAILED DESCRIPTION OF THE PREFERRED EMBODIMENTS

Figure 1:
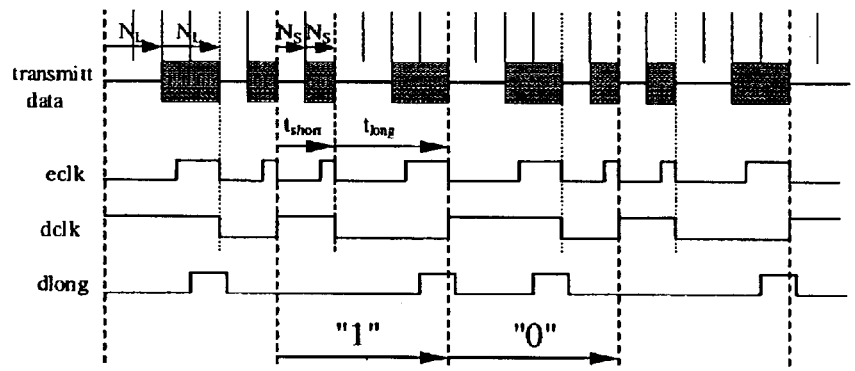
FIG. 1 is a timing diagram for Manchester coded data with output signals.

Manchester coded data can be modulated on a carrier in different ways. One such way is shown in FIG. 1. In this implementation a carrier is switched on and off in long and short bursts. Each time slice representing a bit is divided into six timeslots. A long burst is preceded by one empty timeslot. A long burst is preceded by two empty time slots. Thus, each bit is represented by a coding scheme that consists of either a short pulse followed by a long burst or vice versa with the total duration of the bursts in each time slice being constant.

In this scheme a one is represented by a short burst followed by a long burst, and a zero is represented by a long burst followed by a short burst. The receiver demodulates the received signal and outputs a logic signal ECLK, which consists of a train of pulses corresponding to the short and long bursts. This clocks a toggle flip-flop on its trailing edge to create a signal DCLK, which toggles so that in each time slice it remains in one state (high or low) for the period allocated to the long burst and the opposite state for the period allocated to the short burst. In the example, DCLK is high for the long burst and low for the short burst in the first bit, and vice versa in the second bit. It will be noted that the ratio of the short burst to the long burst is constant for each time slice.

The invention permits the data to be extracted without using counters and oscillators, which require relatively large amounts of power.

Figure 3:
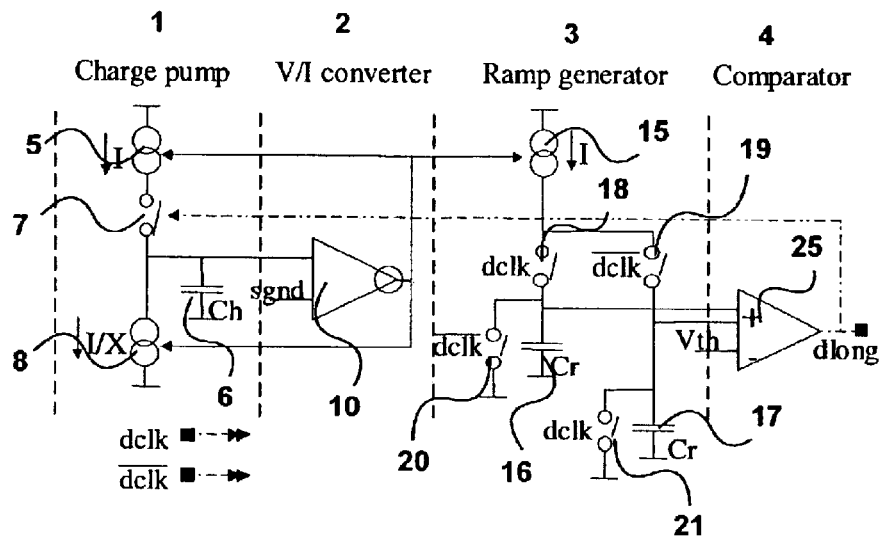
FIG. 3 is a schematic diagram of an exemplary decoding circuit in accordance with the present invention.

Signal DCLK is input to the decoding circuit shown in FIG. 3. This produces an output signal DLONG. The digital signal DLONG goes momentarily high at the end of a long time period and stays low at the end of a short time period. The signal DLONG thus consists of a stream of pulses marking the end of the long periods. The encoded bit stream can be extracted from the signal DLONG.

Figure 2:
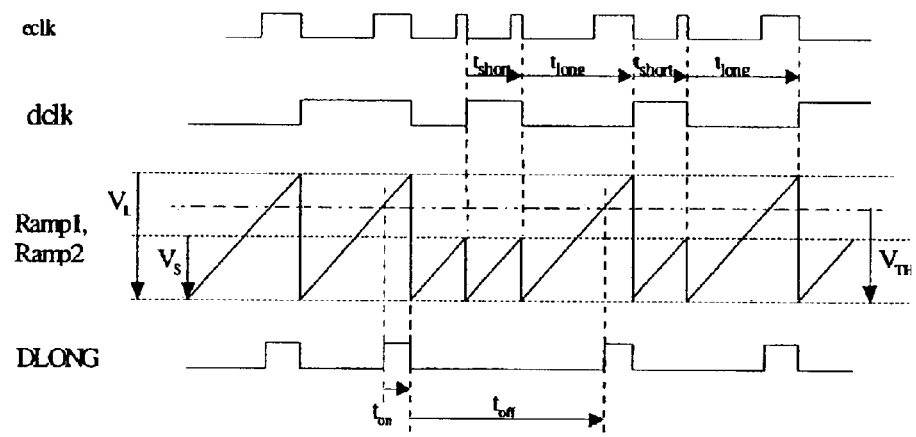
FIG. 2 shows a waveform of a ramp generator in the decoder.

On referring to FIG. 2 it will be seen that for a time period $T >> t_{short} + t_{long}$, the ratio $$K_{ratio} = \frac{t_{on}}{t_{on} + t_{off}}$$

is constant for a stream of data that contains a measurable regular pattern. This means that by measuring the $t_{on}$, $t_{off}$ times at the output of the decoder in DLONG, $K_{ratio}$ can be used as a feedback signal in a feedback system. The feedback signal can be used to change thresholds or modify integration time constants in the analog circuit until the output has the predicted value $K_{ratio}$.

A typical example for the ratio that the time a signal is high to the time that the signal is low is 0.1. If the proper $K_{ratio}$ is chosen a pulse is output at the end of a long time period and not a short time period because the ramp has time to cross the threshold $V_{th}$ for a long time period and not a short time period (see FIG. 2).

This arrangement in accordance with the invention results in an adaptive system wherein it is possible to make an implementation that is only dependent on matching of components and not absolute values. This removes the need for trimming away process variations.

A practical implantation is shown in FIG. 3. In general terms the circuit comprises a charge pump section 1, a voltage-to-current converter section 2, a ramp generator section 3, and a comparator section 4. The charge pump section 1 comprises a current generator 5 which supplies a capacitor 6 through a switch 7. The capacitor 6 can be discharged with a time continuous current through current drain 8 and charged with a switched current through the switch 7. When the circuit has settled down, the averages of the switched charging current and the time continuous discharge current are equal. The output voltage across the capacitor 6 ($C_{ch}$) is $V_{ch}$. This voltage is applied to operational amplifier 10 acting as the voltage-to-current converter 2.

The operational amplifier 10 outputs three different currents which are used by the charge pump section 1 and ramp generator section 3. When the input voltage $V_{ch}$ to the amplifier 10 increases, the output current decreases, preferably in an exponential like fashion.

The ramp generator 3 comprises a current generator 15 controlled by the output of the amplifier 10 and two capacitors 16, 17 supplied with current through respective switches 18, 19 controlled respectively by the input signal dclk and its inversion dclk bar. The capacitors 16, 17 are connected to $V_{ss}$ through respective switches 20, 21. The switches 20, 21 are clocked respectively by the input signals dclk bar and dclk from the demodulator. The capacitors 16, 17 alternate between being charged from the current generator 15 and being discharged through switches 20, 21 to $V_{ss}$.

The capacitors 16, 17 therefore output two alternating saw tooth ramp voltages $V_{ramp1}, V_{ramp2}$ as shown in FIG. 2. The ramp voltages are reset when a transition occurs in dclk. After a long time period the ramp voltage reaches the upper peak value $V_L$ and after a short time period the ramp voltage reaches the lower peak value $V_s$.

The two capacitors and the switch network alternating between the capacitors are arranged such that when one capacitor is in the reset mode the other is being charged.

The comparator section 4 comprises a comparator 25 compares the ramp voltages to a fixed threshold voltage $V_{th}$. The comparator 15 has two positive (non-inverting) inputs connected respectively to the capacitors 16, 17 to receive the respective ramp voltage and one negative input connected to the reference threshold $V_{th}$. The output of the comparator 15 goes high when the ramp exceeds the threshold $V_{th}$. As will be seen in FIG. 2, this only occurs during a long time period since during a short time period the ramp is reset before the ramp can reach the threshold value.

The output of the comparator 25 is the signal dlong, which is fed back to control the switch 7.

It will be seen that the decoder circuit uses two feedback loops. The first feedback loop results from the fact that the output of the V/I generator 4 controls the ramp generator current to change the slope of $V_{ramp1}, V_{ramp2}$ in such a manner that the threshold voltage $V_{th}$ is centered between the peak voltages $V_L$ and $V_S$.

This is achieved by appropriately choosing $$X = \frac{1}{K_{ratio}},$$

where X is the divisor in the current drain 9.

When the circuit has settled down the average charge current is equal to the discharge current and, referring again to FIG. 2, it will be seen that the digital signal dlong goes high at the end of a long time period and low at the end of a short time period.

The second feedback loop results from the fact that the output of the voltage-to-current generator controls the charge pump current in such a way that the circuit adapts in a exponential like behavior by lowering the currents as the voltage $V_{ch}$ increases.

Figure 4:
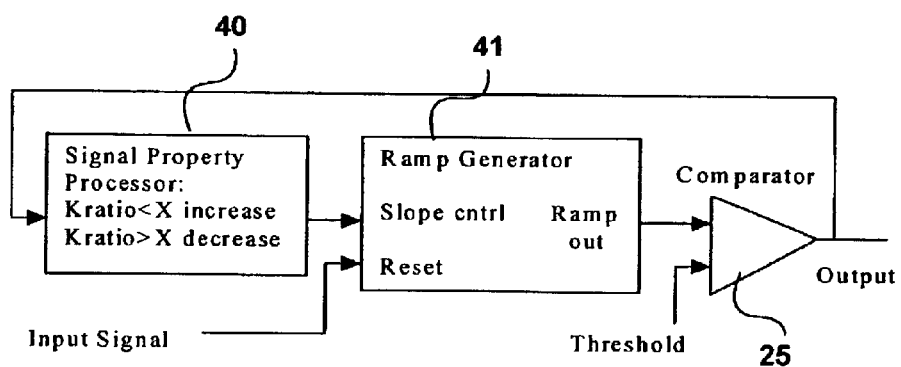
FIG. 4 is a block diagram of a generic decoder in accordance with the invention.

FIG. 4 shows an more generic implementation of the invention. A signal processor 40 receiving as its input the output signal of the decoder generates a control signal to control the slope of ramp generator 41. This produces a ramp voltage that is compared with the threshold voltage $V_{th}$ in the comparator 25. The signal process determines the measured value of $K_{ratio}$ in the output signal and varies the slope of the ramp to match the output signal with the expected value.

Figure 5:
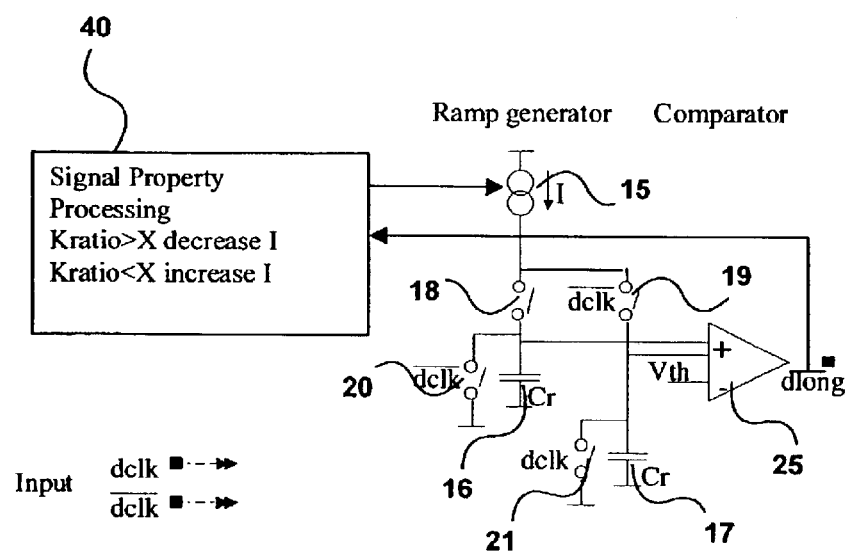
FIG. 5 is a block diagram of a generic decoder with a ramp generator similar to that employed in FIG. 3.

FIG. 5 shows a generic embodiment similar to that shown in FIG. 4 where the ramp generator consists of two alternately switched capacitors. The use of two alternating capacitors saves toggling states and the need for a short reset-pulse circuit in the form of a mono flip-flop. The use of a comparator with two positive inputs comparing the threshold voltage with the ramp voltage saves a comparator.

The described decoder provides an ultra low power Implementation without any high current consuming flip-flops, toggling nodes and oscillators for the time difference measurements. The decoder has an $I_{dd}$ of only 80 nA at 2 KBit/s data rate.

The decoder is adaptive and particularly well suited for decoding Manchester coded data which has a regular bit pattern with a constant number of bits.

The use of two positive inputs in the capacitor removes the need for a reset mono flip-flop, which would result in more complexity and timing based on an RC or a IC time constant.

The decoder circuit of the invention is capable of accepting a large range of data rates. It can be made fully adaptive nature to remove the need for trimming to cancel out process variations. As will be noted, the preferred embodiment is an analog circuit that does not require an external clock, removing the need for an oscillator and thereby saving current, as much as 5–10 times the total power drain. Because the circuit is adaptive and the feedback loop reference is set by a current ratio, errors arising due to the inaccuracy of the RC components can be canceled.

The embodiments presented are exemplary only and persons skilled in the art would appreciate that variations to the above described embodiments may be made without departing from the spirit of the invention. The scope of the invention is solely defined by the appended claims.

What is claimed is:

1. A pulse decoder for decoding a stream of encoded data bits, each data bit being represented by a coding scheme consisting of a combination of short and long duration pulses having a predetermined interrelationship, comprising:
    an input for receiving said stream of encoded data bits;
    an analog signal processor for generating output pulses derived from only one of said short and lone duration pulses in said stream of encoded data bits and from which said stream of encoded data bits can be extracted; and
    a feedback loop for providing a control signal derived from said output pulses to adjust a control parameter governing said analog signal processor so that the average duty cycle of said output pulses matches a predetermined expected value for said coding scheme.

2. A pulse decoder an claimed in claim 1, wherein said output pulses are derived only from said long duration pulses.

3. A pulse decoder as claimed in claim 1, wherein said signal processor comprises a ramp generator for generating a ramp voltage that is reset by transitions in said input signal, and a comparator for generating said output pulses when said ramp voltage exceeds a predetermined threshold, said ramp voltage and said threshold being set so that said threshold is exceeded during a long duration pulse and not exceeded during a short duration pulse.

4. A pulse decoder as claimed in claim 3, wherein said control signal varies the slope of said ramp voltage.

5. A pulse decoder as claimed in claim 4, wherein said threshold is centered between respective peak ramp voltages established after said short and long duration pulses.

6. A pulse decoder as claimed in claim 4, wherein said ramp generator comprises a pair of switched capacitors, each switched capacitor having a first switch for supplying charging current and a second switch for providing a current drain, said first and second switches of said first switched capacitor being controlled respectively by said input signal and an inversion thereof, and said first and second switches of said second switched capacitor being controlled respectively by an inversion of said input signal and said input signal.

7. A pulse decoder as claimed in claim 6, wherein said comparator has first and second signal inputs connected to said respective first and second capacitors.

8. A pulse decoder as claimed in claim 4, further comprising a voltage-to-current converter for controlling said ramp generator in response to said control signal.

9. A pulse decoder as claimed in claim 8, further comprising a charge pump supplying said voltage-to-current converter, said charge pump being controlled by said output pulses.

10. A pulse decoder as claimed in claim 9, wherein said voltage-to-current converter further controls said charge pump so that when an input voltage to said voltage-to-current converter increases, the charge pump current decreases.

11. A pulse decoder as claimed in claim 10, wherein the charge pump current decreases in an exponential-like manner.

12. A pulse decoder as claimed in claim 9, wherein said charge pump comprises an input capacitor providing a voltage input to said voltage-to-current converter, a current generator, and a switch controlled by said output pulses for supplying current from said current generator to said input capacitor.

13. A pulse decoder as claimed in claim 12, wherein said charge pump further comprises a current drain for discharging said input capacitor in a time continuous manner.

14. A pulse decoder as claimed in claim 13, wherein said current drain has a factor 1/X where $$X = \frac{1}{K_{ratio}} \text{ where } K_{ratio} = \frac{t_{on}}{t_{on} + t_{off}},$$

where $t_{on}$ and $t_{off}$ are respectively the on and off times of the output pulses.

15. A method of decoding a stream of encoded data bits, each data bit being represented by a coding scheme consisting of a combination of short and long duration pulses having a predetermined interrelationship, comprising:
    receiving said stream of encoded data bits;
    generating output pulses from only one of said short and long duration pulses in said stream of encoded data bits in an analog signal processor,
    generating a feedback control signal from said output pulses to adjust said analog signal processor so that the average duty cycle of said output pulses matches a predetermined expected value for said coding scheme; and
    extracting said stream of encoded data bits from said output pulses.

16. A method as claimed in claim 15, wherein said output pulses are derived only from said long duration pulses.

17. A method as claimed in claim 15, further comprising generating a ramp voltage that is reset by transitions in said input signal, comparing said ramp voltage to a threshold, and generating said output pulses when said ramp voltage exceeds said threshold, said ramp voltage and said threshold being set so that said threshold is exceeded during a long duration pulse and not exceeded during a short duration pulse.

18. A method as claimed in claim 17, wherein said the slope of said ramp voltage is varied so that the average duty cycle of said output pulses matches said predetermined value.

19. A method as claimed in claim 17, wherein said threshold is centered between respective peak ramp voltages established after said short and long duration pulses.

20. A method as claimed in claim 17, wherein said ramp voltage is generated by a pair of switched capacitors, each switched capacitor having a first switch for supplying charging current and a second switch for providing a current drain, said first and second switches of said first switched capacitor being controlled respectively by said input signal and an inversion thereof, and said first and second switches of said second switched capacitor being controlled respectively by an inversion of said input signal and said input signal.

21. A method as claimed in claim 17, wherein the generation of the ramp voltage is controlled by a voltage-to-current generator supplied by a charge pump controlled by said output pulses.

22. A method as claimed in claim 21, wherein said voltage-to-current converter further controls said charge pump so that when an input voltage to said voltage-to-current converter increases, the charge pump current decreases.

23. A method as claimed in claim 22, wherein the charge pump current is decreased in an exponential-like manner.

24. A method as claimed in claim 15, wherein said predetermined relationship is given by an expression involving $t_{on}$ and $t_{off}$, where ton and toff are respectively the on and off times of said output pulses.

* * * * *